United States Patent [19]

Johnson

[11] Patent Number: 4,978,515

[45] Date of Patent: Dec. 18, 1990

[54] PEROVSKITE FIBERS FROM BIMETAL COMPLEXES

[75] Inventor: Robert E. Johnson, Hoboken, N.J.

[73] Assignee: Hoechst Celanese Corp., Somerville, N.J.

[21] Appl. No.: 51,803

[22] Filed: May 20, 1987

[51] Int. Cl.$^5$ .................. H01B 1/08; H01B 12/00; C01F 17/00; C01F 11/00

[52] U.S. Cl. .................. 423/263; 423/275; 423/593; 501/126; 501/152; 501/95; 252/521; 505/1; 505/780

[58] Field of Search .............. 505/1, 778, 779, 780, 505/781, 725, 737, 738; 423/263, 594, 593, 604, 635, 636; 252/62.9; 501/152, 126, 95

[56] References Cited

U.S. PATENT DOCUMENTS

| | | | |
|---|---|---|---|
| 3,699,044 | 10/1972 | Dosch et al. | 252/62.9 |
| 3,846,527 | 11/1974 | Winter et al. | 264/63 |
| 3,932,315 | 1/1976 | Sleight | 252/521 |
| 4,071,594 | 1/1978 | Pearson et al. | 264/63 |
| 4,485,085 | 11/1984 | David et al. | 423/594 |
| 4,541,973 | 9/1985 | Arons | 264/60 |
| 4,584,280 | 4/1986 | Nanao et al. | 501/80 |

OTHER PUBLICATIONS

"Preparation of Barium Titanyl Oxalate Tetrahydrate for Conversion to Barium Titanate of High Purity", W. Stanley Clabaough et al., *Journal of Research of the National Bureau of Standards*, vol. 56, No. 5, May 1956, p. 289.

"Preparation of Semiconducting Titanates by Chemical Methods", Patrick K. Gallagher et al., *Journal of the American Ceramic Society*, vol. 46, No. 8, Aug. 21, 1963, p. 359.

"A Simple Technique for the Preparation of R. E. FeO$_3$ and R. E. CoO$_3$", P. K. Gallagher, *Materials Res. Bull.*, 3, 1968, pp. 225–232.

"Single Crystal Growth of Ba(Pb, Bi)O$_3$ from Molten KCl Solvent", Akinori Katsui et al., *Japanese Journal of Applied Physics*, vol. 21, No. 3, Mar. 1982, pp. L157–L158.

"Evidence for Superconductivity Above 40 K in the La—Ba—Cu—O Compound System", C. W. Chu et al., *Physical Review Letters*, vol. 58, No. 4, Jan. 26, 1987, pp. 405–407.

"Superconductivity Seen at Record High Temperatures in Metal Oxides", Ron Dagani, *Chemical and Engineering News*, Feb. 2, 1987, pp. 29–30.

"Superconductivity: A Revolution in Electricity is Taking Shape", Ron Dagani, *Chemical and Engineering News*, May 11, 1987, pp. 7–16.

"Putting Superconductors to Work—Superfast", Michael L. Abramson, *Business Week*, May 18, 1987, pp. 124–126.

*Primary Examiner*—Mark L. Bell
*Attorney, Agent, or Firm*—Depaoli & O'Brien

[57] ABSTRACT

Complex metal oxides are formed by calcining in molecular oxygen such as air at least one bimetallic complex of the formula A[BY] wherein A and B are metals and Y is a ligand associated with B. The bimetallic complexes are precipitated from aqueous solution by a transposition reaction of AX and M[BY] wherein X is a disassociable anion and M is a cationic species. The bimetallic complexes are useful in forming pure complex metal oxide fibers by a process of either dispersing the complex metal oxide or bimetallic precursors in a spinning composition of fluid organic polymer or by imbibing a polymeric fiber with species AX and precipitating out the bimetallic complex by treating the imbibed fiber with a compound containing the BY complex. The process is also useful in forming superconductive complex metal oxides. The use of the bimetallic complex as precursors for the complex metal oxides provide improved mixing of the metal elements on an atomic scale and thus require less severe mixing and annealing conditions to form the oxide.

13 Claims, No Drawings

PEROVSKITE FIBERS FROM BIMETAL COMPLEXES

FIELD OF THE INVENTION

The present invention is directed to a method of forming complex metal oxide compositions from bimetallic complexes and to fibers formed from such complex metal oxides.

BACKGROUND OF THE INVENTION

There are a vast number of complex metal oxides which contain two or more metal cations. The complex metal oxides are present as a homogeneous phase having a generally well defined crystalline structure wherein the metal atoms and oxygen atoms are organized into a compact network according to the requirements of the neutralization of the charges of the metal cations and oxygen anions. The complex metal oxides occur in numerous basic crystalline structural types, the names of which are often derived from the principle compound shown to have that type of crystal structure. For example, spinels which have the structure of the mineral spinel, $MgAl_2O_4$, have the general formula $AB_2O_4$, and perovskites which have the structure of the mineral perovskite, $CaTiO_3$, have the general formula $ABO_3$, wherein A and B are metals and where A and B occupy respective sites in the crystal lattice. Often, a portion of either or both the A and B sites are replaced with other metal cations.

The complex metal oxides are of growing importance to industry. Spinels and perovskites, for example, are often piezoelectric and ferromagnetic materials and as well are known to have important magnetic, optical and electrical properties. Very recently, it has been discovered that certain complex metal oxides are superconducting at anomalously high critical temperatures ($T_c$). The crystal structure of one group of these newly discovered superconductive complex metal oxides is believed to be one similar to the crystal structure of $K_2NiF_4$ and has a general complex metal oxide formula of $A_2BO_4$ wherein A is lanthanum and a small portion of lanthanum sites are replaced with Ba or Sr. B is copper. The crystal structure is a layered one containing a $CuO_6$ octahedral coordination at the corners like that of a perovskite separated by La,SrO layers. Another complex metal oxide with the formula $YBa_2Cu_3O_7$ also contains perovskite structure and has been found to be superconducting at unusually high temperatures. The high $T_7$ which has been found in these metal oxide superconductors holds much promise that such superconductive materials will be in common use.

Complex metal oxides are generally prepared by coprecipitating the metal salts or by weighing the metal oxides which form the complex metal oxide product to provide the necessary stoichiometric amounts of each metal and repeatedly grinding and firing the precursor mixture. While the grinding procedure has yielded the desired complex metal oxide, the method is time consuming, inasmuch as sufficient grinding is necessary to provide a homogeneous mixture of the respective metal cations on an atomic scale. Further, it is often difficult to obtain complex metal oxides in which the respective metals are present in the proper weight ratio to provide the desired crystalline structure such as a spinel, perovskite, etc. To prepare complex metal oxides from a mixture of separate metal salts or oxides, the amount of the respective metal salts or oxides, as well as the mixing and calcining conditions all have to be considered to obtain the desired structure. Typically, crystals of the complex metal oxides obtained by the prior art techniques contain several metallic phases, including one or more metal oxide phases of each respective metal, the desired homogeneous complex metal oxide phase, and other complex metal oxide phases. Not surprisingly, the presence of non-homogeneous metal oxide phases has been reported in the preparation of the superconducting complex metal oxides. For example, it has been reported that preparations using the traditional method of coprecipitation have not proved satisfactory for the superconducting $YBa_2Cu_3O_7$ composition. The presence of a non-superconducting phase, the result of inhomogeneous stoichiometry, is a recurring problem in methods that rely on mechanical mixing and, apparently, even the coprecipitation procedure that generally gives good dispersion can result in impure material. Accordingly, a method that disperses the metals on an atomic scale in the desired stoichiometry is needed to overcome this problem.

A technique for forming perovskites, in particular, the preparation of rare earth ferrites and analogous cobalt compounds has been reported by Bell Telephone Laboratories, Gallagher, P.K., *Materials Res. Bull.*, 3, 1968, pp. 225-32, in which rare earth ferrocyanide or cobalticyanide compounds, e.g., $LaFe(CN)_6 \cdot XH_2O$ were precipitated from aqueous solution. For example, lanthanum chloride was dissolved in water and precipitating agents such as ammonium ferrocyanide and potassium cobalticyanide were added. Upon calcination of the precipitate in air at 1,000° C., pure perovskites of $LaFeO_3$ and $LaCoO_3$ were formed with no evidence of $La_2O_3$, $Fe_2O_3$ or nonperovskite mixed metallic compounds. The advantages of the technique are the nearly perfect control of the rare earth to transition metal ratio at unity, complete homogeneity of the metallic compounds, good purity and ease of preparation because the normally required repetitive grindings and heating are eliminated, and finally a means of control over the particle size of the desired material by means of the choice of conditions for calcination.

An analogous system has been reported for forming $BaTiO_3$. The method involves reacting barium chloride with potassium titanyl oxylate in which calcination of the precipitated barium titanyl oxylate results in the barium titinate ($BaTiO_3$), *Journal of the American Ceramic Society*, Vol. 46, No. 8, Aug. 21, 1963, p. 359, and *Journal of Research of the National Bureau of Standards*, Vol. 56, No. 5, May 1956, p. 289. None of these articles address the formation of complex metal oxides other than perovskites in which the metals are present in a 1:1 ratio.

In recent years the formation and use of inorganic fibers, in particular, metal oxide fibers, have received increasing attention. Such interest may be traced at least in part to new demands of industry for fibers capable of withstanding elevated temperatures without deleterious effects. The growing aerospace industry, for example, provides many applications for light and strong heat resistant fibrous materials.

The formation of inorganic metal-containing fibers has required elaborate and time-consuming procedures inasmuch as such compounds possess high melting points which render melt-spinning either impossible or extremely difficult. Accordingly, procedures for forming inorganic fibers usually involve the addition of metal or metallic compounds to polymeric spinning solutions or to already spun polymeric fibers and subsequent thermal conversion to metal carbides, metal nitrides, metal oxides, etc. wherein the polymeric material is either used as a carbon source for forming carbides or is simply used as a carrier for the metallic components and consumed during thermal treatment.

In the formation of metal oxide fibers, the metals are often present in the form of inorganic or organic salts which are added to the spinning polymer solution or such salts are imbibed in preformed polymeric fibers. Upon calcination in air, the metal salts are converted to the respective metal oxides. Examples of such procedures are disclosed in U.S. Pat. Nos. 3,846,527; 4,010,233, 4,485,085 and 4,541,973. The two latter patents are directed to the formation of ferrimagnetic spinel fibers. U.S. Pat. No. 4,541,973 adds the powdered spinel into a spinning solution. In the methods described in the other mentioned patents, the metals are added as metal salts containing the metal species in the cationic form. Even in the formation of complex metal oxide fibers, the respective metal compounds are added separately to the spinning solution or imbibed into the preformed fibers in the form of various metallic salts in which each metal is a cationic species. Exact control over the proper weighing of the various metal salts are thus needed to form the desired metal oxide product. As stated above, it is often difficult to provide the stoichiometric amount of each metal when added in the form of metal salts so as to yield the desired mixed metallic oxide. It is difficult as well to provide the proper mixing of the metal salts and calcining conditions. Thus, oxide phases other than the desired homogeneous complex metal oxide phase are usually formed.

In view of the growing applications for complex metal oxides it would be worthwhile to provide complex metal oxide fibers and adapt such fibers for a wide range of prospective applications involving optics, electronics, as well as piezoelectric, magnetic, and superconductive applications. However, there remains a need for a new and improved process for the production of complex metal oxide fibers where the composition of the complex metal oxide can be more readily controlled to yield the proper ratio of the metal cations and form increasingly purer homogeneous complex metal oxide phases.

Accordingly, it is an object of this invention to provide an improved process for the production of complex metal oxide fibers.

It is another object of this invention to provide a process for the production of complex metal oxide fibers of improved purity.

Still another object is to provide a process for the production of complex metal oxide compositions of improved purity.

Yet another object is to provide an improved process for producing superconductive complex metal oxide compositions.

Other objects and advantages of the present invention shall become apparent from the accompanying description of the invention and appended claims.

SUMMARY OF THE INVENTION

In accordance with the present invention, complex metal oxide fibers are produced having improved purity of the homogeneous complex metal oxide phase. The fibers are formed by dispersing a complex metal oxide precursor in powder form into a spinnable fluid organic polymer to form a spinning composition, spinning the composition to form solid fibers and pyrolyzing the fibers in oxygen at a temperature between about 800–2,000° C. to convert the precursor to the desired complex metal oxide and burn off the fluid polymer so as to form the complex metal oxide in fiber form.

The complex metal oxide precursors are precipitated bimetallic complexes which contain the proper stoichiometric amounts of each metal which are eventually contained in the crystal of the desired complex metal oxide. In general, the complex metal oxide precursors are precipitated from aqueous solution and are formed by dissolving in water a metal salt of the formula AX wherein A is a metal cation and X is an inorganic or organic anionic species and adding to the solution a precipitating agent comprising a metal complex of the formula M[BZ] where B is a metal cation, M is a cationic species and Z is ligand associated with metal B. The precipitated bimetallic complex is formed by the transposition of metal cation A for cation M and has the general formula A[BZ] wherein A, B and Z are as previously described.

In the formation of perovskites of known formula $ABO_3$, the precipitated bimetallic complex essentially assures that the respective metals are provided in a 1:1 ratio and, thus, upon being calcined to the perovskite the formation of metal oxide phases other than the homogeneous perovskite phase is greatly reduced and has been shown to be nonexistent. A method of forming complex metal oxides other than perovskites wherein only two metals are present can be achieved in accordance with the present invention by precipitating a bimetallic complex which due to the choice of the individual anionic species X and ligand Z, the ratio of A to B in the bimetallic complex is other than 1:1. Further, complex metal oxides can be produced from a mixture of two or more bimetallic complexes, wherein the amount of the respective metals in the mixture of precipitated bimetallic complexes is equivalent to the stoichiometric amount of each metal needed to form the desired complex metal oxide. Inasmuch as complex metal oxides of A and B often contain other metals which are substituted for a portion of the A and B metal cations in the crystal lattice, and, thus, the complex metal oxide contains more than two metals, the use of mixtures of precipitated bimetallic complexes is required as the oxide precursor. Thus, for perovskites of formula $A_xA'_{1-x}BO_3$, a mixture of precipitated $A_x[BZ]_x$ and $A'_{1-x}[BZ]_{1-x}$ complexes can be formed, and the mixture pyrolyzed in oxygen to yield the desired complex metal oxide. The precipitation process of the present invention ensures that the correct stoichiometric amounts of each metal are present in the mixture. Importantly, all of the precipitated metals are associated in bimetallic complexes. Thus, the respective metals are more homogeneously mixed on an atomic scale than are the separate metallic species used in prior art methods. Less grinding, lower annealing and lower calcining temperatures are needed to form the desired complex metal oxide and the formation of single metal oxide phases is substantially eliminated using the process of the present invention.

Recently, it has been found that certain complex metal oxide compositions are superconductive at $T_c$ much higher than has been previously been achieved. Examples of these superconductive complex metal oxides include crystalline phases of Y,La—Ba,Sr—Cu—O compositions in which the homogeneous complex oxide phase includes perovskite structure type. In accordance with the present invention, the superconductive complex metal oxide or precursor is ground into powder and loaded into a fluid organic polymer to form a spinning composition, the composition spun into fibers and the fibers heated to remove the organic carrier and yield complex metal oxide superconductive fibers. The superconductive complex metal oxides can be formed by mixing at least one precipitated bimetallic complex optionally with a separate metal oxide or salt precursor to form a complex metal oxide precursor mixture which contains the metal cations in the proper stoichiometry. The precursor mixture is then fired to the oxide form. For example, for La—Sr—Cu—O compositions, one or both of the bimetallic complexes of La—Cu and Sr—Cu can be formed by the precipitation process of the present invention, and the complexes mixed together or the individual bimetallic complexes mixed with other metal salts to form the complex metal oxide precursor mixture.

By using the precipitated bimetallic complexes of this invention as the starting materials for the complex metal oxide, there is virtually no limit as to the types of metals which can be formed into complex metal oxides, nor is there any limit as to the stoichiometry of the metals. The atomic mixing of the various metals is vastly improved using the procedure of the present invention relative to the prior art procedure of mixing the individual metallic species, that pure homogeneous phases of the complex metal oxide are obtained. Also, the use of such complex metal oxide precursors are of great advantage in the formation of complex metal oxide fibers of high purity.

DETAILED DESCRIPTION OF THE INVENTION

The types of complex metal oxides which can be produced and, if desired, shaped into complex metal oxide fibers by the process of the present invention are virtually limitless. Generally, the complex metal oxides which can be formed by this invention are A—B—O compositions in which the stoichiometric ratio between metals A and B and oxygen are only limited to the extent that stoichiometry between specific metals and oxygen are incapable of being formed into a finite crystal structure. It is to be understood that the general formula A—B—O used to define useful complex metal oxides of this invention is also meant to include complex metal oxide compositions in which a portion of the A and/or B metal sites on the crystal lattice are substituted by one or more different metal cations. Any number of different metal cations can be used to replace the A and/or B metals in the crystal lattice of the complex metal oxide. More common structures are obtained by the substitution of one metal, respectively for a portion of the A or B metals or both such that the complex metal oxide contains at most four metals. This is not to be intended as limiting the invention, however, as the present invention is applicable to the formation of complex metal oxides containing any number of metals having any stoichiometric configuration.

Complex metal oxides of the general formula A—B—O as defined above are formed in accordance with the present invention by precipitating from aqueous solution one or more bimetallic complexes which are converted to the desired complex metal oxide by thermal treatment in molecular oxygen. The bimetallic complexes are formed by dissolving in aqueous solution a metal salt of the formula AX, wherein A is a metal element and X is an inorganic or organic anionic species, and adding as a precipitating agent to the solution a metal complex of the formula M[BZ] wherein B is a metal element, M is a cationic species and Z is a ligand associated with metal element B. In its simplest form, the precipitation is achieved by transposition of the M cationic species associated with metal complex [BZ] with cationic metal species A. The reaction can be defined simply as $AX + M[BZ] = A[BZ] + MX$. The bimetallic complex A[BZ] precipitates from solution while salt MX remains in solution as does any excess of the respective metal salt AX or metal complex M[BZ].

For those complex metal oxides which comprise only two metals, most, if not all, stoichiometry between the A and B metals can be achieved from a single precipitated bimetallic complex by use of the correct choice of anions X and ligands Z. If, however, the complex metal oxide to be produced contains three or more metals it will be necessary to precipitate a plurality of bimetallic complexes wherein the mixture of bimetallic complexes contain the metals in the stoichiometric amounts sufficient to form the desired complex metal oxide. For example, a perovskite of formula $A_xA'_{1-x}BO_3$ can be formed from a perovskite precursor which contains a mixture of precipitated bimetallic complexes comprising $A_x[BZ]_x$ and $A'_{1-x}[BZ]_{1-x}$.

By the process of this invention, any excess metallic species which do not react remain in solution and, thus, the stoichiometry of the precipitated metals can be more carefully controlled than by weighing the various metal oxides as is the typical method in the art. More importantly, by using precipitated bimetallic complexes, even a mixture of bimetallic complexes as the complex metal oxide precursor, there is a greater mix of the metals on an atomic scale than can be achieved by mixing the separate metal oxides or metal salts as in prior art processes. Thus, the desired complex metal oxide can be obtained by use of relatively low temperature calcination without repeated grinding and annealing as in the prior art. These repeated grinding and annealing steps are time consuming and inevitably lead to contamination of the product. In those instances wherein a bimetallic complex oxide is desired and the precursor is formed by a single precipitation of a bimetallic complex, calcination to the desired complex metal oxide can be achieved in a single relatively low temperature calcination without any subsequent milling or annealing steps.

The metals which can form the complex metal oxides in accordance with the process of the present invention can be any metal from Groups I to VIII of the periodic table of elements. Moreover, there is no limit as to the amounts or types of different metals which can be substituted for metals in the crystal lattice structure. While not wishing to limit the invention to any extent, the process for forming complex metal oxides as described herein have particular usefulness in forming perovskite, $ABO_3$, fibers, spinel, $AB_2O_4$ fibers, including ferrimagnetic spinel fibers, $AFe_2O_4$, and superconductive metal oxides and oxide fibers having at least a portion of the crystal containing perovskite structure. Thus, for example, the process of this invention has usefulness in forming superconductive complex metal oxides having a crystal structure like that of $K_2NiF_4$ which has the general crystallite formula of $A_2BO_4$ wherein a small portion of the metal cations A are replaced with another metal cation. The perovskites are often catalytic, piezoelectric and ferrimagnetic materials and are known to have important magnetic, optical and electric properties. Likewise, the spinels, in particular, the ferrimagnetic spinels have use in important electrical and magnetic applications.

The metal salts, AX, can be formed from any inorganic or organic anionic species. Typically, the anionic species must form water soluble salts with metal A and be readily disassociable so as to render the transposition reaction favorable. Useful inorganic salts include the halides, oxyhalides, nitrates, nitrites, sulfates, silicates, phosphates, borates, carbonates, hydroxides, etc. The metal salts may be organic and derived from anionic species including organic acids, such as monocarbonic acids, di or polycarbonic acids, oxoacids, hydroxyacids, aminoacids, or sulfonic acids and derivatives thereof. Specific examples of these organic acids are: formic acid, acetic acid, acrylic acid, benzoic acid, cinnamic acid, oxalic acid, malonic acid, adipic acid, maleic acid, fumaric acid, phthalic acid, tartaric acid, citric acid, pyruvic acid, glycolic acid, lactic acid, mandelic acid, tartronic acid, malic acid, salicylic acid, glyoxylic acid, pyroracemic acid, glycocol, amino-triacetic acid, ethylendiamintetraacetic acid, ε-aminocapronic acid, anthranilic acid, methane-disulfonic acid, taurine, benzenesulfonic acid, sulfanilic acid.

The metal compounds AX equally comprise the compounds in which the metal A is bound to an organic group by bridging oxygen and/or nitrogen atoms, such as metal alcoholates, metal $\beta$-diketo compounds as e.g., metal acetylacetonates, metal amine compounds or metal aminoalcohol compounds. Therefore the organic group may be derived for instance from methanol, ethanol, propanol, butanol, glycol, glycerol, methylamine, ethylamine, ethylendiamine, diethylentriamine, tetremethylendiamine, hexamethylentriamine, pyridine, B-$\beta$'-dipyridyl, ethanolamine, triethanolamine, chinoline, oxychinoline.

The organic anion X may also be attached directly to the metal by a metal-carbon bond, as in Grignard compounds and other metal-organic compounds with localized metal-carbon bonds, or by pi-bonding of one metal to several C-atoms, as e.g., in cyclopentadienyl metal compounds. Thus, the organic anionic species may be a ligand and form nondisassociable complexes with metal element A. This may be advantageous under certain situations to alter the effective charge of the metal cation and allow the formation of bimetallic complexes of certain metal to metal stoichiometry which would not otherwise be formed using the simple disassociable anions. For example, polydentate ligands such as polycarbonic acids, EDTA and the like, can be readily utilized. If the X anions are ligands, the formed metal complexes with A should be such that the [AX] metal complex is attracted to the [BZ] metal complex. Associated cations and/or anions may have to be added to the aqueous solution to balance the charges. Thus, if the overall charge of [AX] is positive, an additional disassociable anionic species will be needed to form the neutral salt, e.g., $[AX]+D^-$, wherein D is a disassociable anion.

Ligand Z comprises nondisassociable neutral or negative ligands. It is important that the ligand be heavy enough to precipitate the bimetallic complex and as well be fully consumed during thermal treatment of the precursor bimetallic complex to the complex metal oxide so that no residue of the ligand remains in the final oxide product. Nonlimiting examples of useful ligands include the cyanides and polycarbonic acids such as oxalic acid, tartaric acid, citric acid, and ethylendiamintetraacetic acid (EDTA), etc. Any ligand which can be complexed with a metal and which is characterized as discussed above can be used as the anionic species Z. Thus, any of the inorganic or organic species mentioned for X which will form nondisassociable metal complexes with metal B can be utilized. Additional ligands which can be used include: crown ethers, biuret or any other organic ligand species that can be burned away without leaving a residue and will precipitate the bimetallic complex from an aqueous solution. The variability of the choice of ligand which can be used for Z and even for anionic species X allows the wide variety of bimetallic stoichiometry in the precipitated metal complexes and subsequently formed complex metal oxides which characterize the process of the present invention. For example, rigid polydentate ligands may be complexed with two or more metals to provide A to B stoichiometry of other than 1:1. Additionally, the use of flexible polydentate ligands such as EDTA and which wrap around a particular single metal cation may be used to alter the effective charge of such cation. For example, $La^{+3}$ can be complexed with $[EDTAH_2]^{-2}$ to yield an overall charge on the lanthanum cationic species of $+1$ thus, altering the effective charge of the lanthanum cation. An additional ligand which can be used, although not preferred in view of the difficulty in controlling the complexes which are formed are the polyoxo anionic species $(O_x)$ wherein x is an integer greater than 2.

Cation M is one which is readily disassociable from metal complex [BZ] and which will be displaced by cationic metal A or a cationic metal A complex. Typical cations include alkali metal, alkaline earth metal and ammonium.

The bimetallic complexes are precipitated from aqueous solutions. The pH of the solution may have to be adjusted if acid ligands are utilized to complex with either of metals A or B. Thus, with certain polycarbonic acid ligands, the pH will be critical in determining the charge of the ligand and the ultimate effective charge of the metal cation. Upon being precipitated, the bimetallic complex should be washed with water to ensure that all nonreactive species are returned to solution.

The method of forming complex metal oxides by the calcination of precipitated bimetallic complexes as in the present invention is an important procedure in controlling the metal oxide phases formed in the complex metal oxide product.

Thus, complex metal oxides of the formula A—B—O wherein A and B are metals and at least one of A or B is substituted with an additional metal can be formed from precipitated bimetallic complex precursors and characterized by the absence of unitary metal oxide phases. By this is meant that the complex metal oxide product does not include metal oxide crystals containing one metal having a defined crystal structure other than that of the homogeneous complex metal oxide phase.

Novel complex metal oxide superconductors have recently been discovered. It has been found that the bulk of these complex metal oxide superconductors have perovskite-like crystal structure. One such crystal structure for superconducting La—Ba,Sr—Cu—O compositions has been identified to be like that of $K_2NiF_4$. However, as yet to be discovered is whether it is the homogeneous complex metal oxide phase alone which is superconductive or whether some other metal oxide phase or combination of metal oxide phases contribute to the superconductive properties.

The recently discovered superconducting complex metal oxides can be considered to comprise A—B—Cu—O compositions wherein A comprises the metals of Group IIIB and the lanthanide series of metal elements and B comprises Group II alkaline earths. While copper has been the only metal to provide superconductivity, it is believed that similar first row transition metals such as V,Cr, Mn, Co, Ni may be useful. At present, only lanthanum and yttrium of Group IIIB and most of the rare earths, and barium and strontium of the Group II alkaline earths have been found to yield superconductive properties. In general, the present invention is useful in preparing superconductive complex metal oxides comprising A—B—Cu—O compositions as defined above. Specific superconductors which have been found and can be prepared by the process of this invention include but not limited to $La_{1.7-1.85}Sr_{0.15-0.3}CuO_4$ and $YBa_2Cu_3O_7$.

The superconducting complex metal oxides have been formed by prior art techniques of mixing the respective metal oxides or coprecipitated metal salts and providing the atomic mixing of the elements by repeated grinding and annealing steps. Use of these prior art techniques results in the formation of a plurality of metal oxide phases. As discussed above, it is not yet clear which oxide phase or combination of oxide phases yields the superconducting properties. In any event, the prior art technique of grinding the separate metal species does not provide for control over which metal oxide species or the number of metal oxide species which are formed. On the other hand, the process of the present invention which utilizes precipitated bimetallic complexes as the metal oxide precursor provides for mixing of at least two of the metal species on an atomic scale and, thus, allows for better control of the metal oxide phases which are formed. For example, if single metal oxide phases are detrimental to superconductive activity, the complex metal oxide can be formed by mixing a plurality of precipitated bimetallic complexes. Since all the metals would be mixed on an atomic scale with a second metal, the likelihood of the formation of any unitary metal oxide phase would be greatly reduced, if not eliminated. On the other hand, if a small proportion of one or more single metal oxide phases is required to yield the superconductivity, a metal oxide precursor containing only one metal can be mixed with one or more precipitated bimetallic complexes and calcined to yield the desired proportion of unitary metal oxide phases and the required homogeneous complex metal oxide phase. It is the ability to mix the desired metals on an atomic scale which renders the use of precipitated bimetallic complexes as precursors for the superconductive complex metal oxide more advantageous than the prior art processes which require repeated grinding and annealing of the separate metallic species to obtain the mixture of metals on an atomic scale.

Accordingly, preferred superconductive complex metal oxides which are formed by the process of this invention are characterized by being essentially free of metal oxide phases containing only a single metal and containing less than 1% of metal oxide phases other than the homogeneous complex metal oxide phase. Such other phases are meant to include amorphous metal oxide phases or metal oxide crystals which contain the respective metals bonded to oxygen in a defined crystal structure other than that of the superconducting homogeneous complex metal oxide phase.

The process of making such pure superconductive complex metal oxides is achieved by using as the precursor, a precursor mixture which does not contain metallic species which contain only one metal. Thus, superconductive complex metal oxides are formed by providing all the metal elements in the form of the bimetallic complexes. Thus, a precursor mixture comprising one or more Group IIIB-copper bimetallic complexes and one or more Group IIA-copper bimetallic complexes in which all the elements in the total mixture are provided in the proper stoichiometry is a useful precursor mixture which yields the desired superconductive product free of additional unitary metal oxide phases. Thus, examples of useful precursor mixtures comprise one or more bimetallic complexes of lanthanum or yttrium with copper and one or more bimetallic complexes of strontium or barium with copper. In view of the nonstoichiometric ratio, i.e., fractional, between the group IIIB metal such as lanthanum or yttrium and copper found in some of the superconductors, it is unlikely that the bimetallic complex between these metals can be formed using a simple metal salt for anion X. Accordingly, X will likely contain a ligand which is complexed with the group IIIB metal. Thus, the precipitated bimetallic complex between the group IIIB metal such as lanthanum or yttrium with copper will likely be a complex comprising two metal complexes where the effective charge on the respective metals are manipulated to yield the proper stoichiometry ratio of the metals. Likely, more than one of such bimetallic complexes of the group IIIB metal and copper will be needed to provide the proper stoichiometric amounts of these two components.

Shaped complex metal oxides, in particular, complex metal oxide fibers, can be produced by forming a spinning composition comprising a fluid organic polymer medium having dispersed therein either the complex metal oxide particles formed as in the process of the present invention or the precipitated bimetallic complex powders; spinning the composition into a coagulating medium to form solid polymeric fibers; and pyrolyzing the fibers at a temperature between about 800° to 2,000° C. in the presence of molecular oxygen to burn off the polymer and convert any bimetallic complex precursor to the complex metal oxide. Sufficient amounts of complex metal oxide or precursor solids are dispersed in the polymer to maintain fiber integrity once the polymer is burned off.

The term "spinning" refers to attenuation of a viscous fluid composition into fibers by mechanical means, such as by extrusion through a spinneret.

The term "coagulating medium" refers to either wet or dry means of solidifying a fiber formed by mechanical attenuation of a spinnable composition.

The particle size of the powders dispersed in the spinning composition, whether the powders are the complex metal oxide product or the precipitated bimetallic complex precursor, is important and will typically not be greater than 50 microns, preferably not more than about 10 microns. Particles as low as 1 micron and submicron size are most preferred since the smaller the particle size, the easier it is to spin the composition and the greater is the strength and flexibility of the complex metal oxide fiber. The precipitated bimetallic complexes will generally be precipitated in particle sizes of under 5 microns. The term "particle size" refers to the average diameter of the complex metal oxide or precipitated bimetallic precursor particles.

The ultimate mechanical properties of the complex metal oxide fibers are also directly effected by the content of the complex metal oxide or precursor dispersion in the spinning solution. It is advantageous to provide the highest possible weight content of complex metal oxide or precursor powder in the spinning composition, while maintaining the desirable spinning properties of the composition. The complex metal oxide or precursor content usually will be in the range between about 20–95 wt.%, and preferably in the range between about 40–80 wt.%.

The fluid polymer medium used in the spinning composition can comprise any natural or synthetic organic polymer which supports the complex metal oxide or precursor powder in the dispersed state, and which provides a proper viscosity for effective spinning, and which does not melt under the pyrolysis conditions and under such conditions will be fully consumed.

Illustrative of suitable polymers are polyisobutylene, polyisoprene, polystyrene, polymethyl methacrylate, polyvinyl alcohol, polyacrylonitrile, polyacrylamide, polyacrylic acid, polyethylene oxide, cellulose, carboxymethyl cellulose, hydrolyzed starch, dextran, guar gum, polyvinylpyrrolidone, polyurethane, polyvinyl acetate, and the like, and mixtures thereof.

The preferred molecular weight for the polymer medium species will vary depending on the particular polymer type selected, the presence or absence of a solvent diluent, and the viscosity range desired for the spinning composition. The molecular weight of the polymers will typically vary over the range between about $10^3$–$10^6$.

In most cases a solvent diluent is employed to provide a spinning composition (i.e., a spinning dope) with a room temperature viscosity range between about 0.1–3,000 poises, and preferably between about 100–1,000 poises.

The solvent employed with a water-miscible polymer can be water and/or a water-miscible solvent such as methanol, ethanol, acetic acid, dimethylformamide, tetrahydrofuran, and the like.

The solvent employed with an oil-soluble polymer can be an organic solvent such as benzene, hexane, dichloroethylene, dimethylacetamide, dibuyl ether, ethyl acetate, and the like.

Spinning can be accomplished with either the wet or dry spinning techniques. In dry spinning, the spinning composition issues from the spinning apparatus through a spinning column wherein a stream of drying gas is simultaneously fed through the spinning column. The temperature of the spinning column and that of the drying gas is dependent on the volatiles which have to be evaporated from the filament during its passage through the spinning column.

In wet spinning, the spinning dope is extruded into a spin bath where coagulation of the spinning solution and the formation of the fiber occurs. A variety of suitable solvent-nonsolvent systems are known in the fiber art for use as the coagulating medium or spin bath. Suitable spin baths are nonsolvents for the organic polymer contained in the spinning composition and do not chemically react with the spinning solution. Also, the spinning bath should not attack the complex metal oxide or bimetallic precursors. Thus, certain coagulating baths such as those comprising aqueous mineral acid solutions may attack certain reactive metals such as aluminum and should be avoided when such reactive metals are present. The fiber can be washed to remove any adhering traces of the spin bath, and then dried.

After a newly formed fiber is spun, usually it is stretched or drawn to about 100–300 percent of its original length by conventional techniques.

The precursor polymeric fiber can be converted to any one of a variety of fibrous configurations prior to undergoing thermal treatment. For example, the fiber can be in the form of filaments, staple fibers, tows, plied yarns, knits, braids, fabrics, or other fibrous assemblages while undergoing thermal treatment. Alternatively various fibrous configurations may be formed form the inorganic fibers at the conclusion of the pyrolysis step of the process.

To provide a final complex metal oxide fiber product with optimal physical properties, it is preferred to subject the precursor polymeric fiber from the precursor fiber formation step to an initial thermal treatment in a molecular oxygen environment. The organic polymer substrate in the precursor fiber is partially carbonized to a stabilized form so that the subsequent pyrolysis step of the process can be effected without the concomitant destruction of the fibrous configuration. The thermal treatment step can be conducted by heating the precursor fiber in a molecular oxygen-containing atmosphere at a temperature ranging between about 200°–600° C. The thermal treatment temperature selected is dependent upon the polymer resistance to distortion at elevated temperatures, and should not exceed the polymer melting point during at least the initial phase of the thermal treatment.

Volatile components that evolve during the thermal treatment step include water vapor and oxygen, and carbon monoxide and carbon dioxide resulting from a partial combustion of the polymer. Typically a 15–50% reduction in the weight of the precursor fiber occurs during the thermal treatment step. It is believed that a crosslinking of carbon atoms occurs during the thermal treatment to produce a charred structure which is capable of serving as a carrier for the inorganic content of the fiber.

The thermal treatment can be performed in an auto clave by heating to the required temperature/time schedule. A continuous thermal treatment can be accomplished by the continuous passage of a precursor fiber through a heated chamber or calcining furnace. The fibrous structure of the precursor fiber is retained throughout the thermal treatment step. There is a tendency for the precursor fiber to shrink while undergoing thermal treatment.

Alternatively, the precursor fibers can be subjected to a chemical stabilization treatment before being subjected to the pyrolysis step. In a typical stabilization procedure, the dried fibers are contacted with a reactive free radical-forming agent such as diazidoformamide, which effects the desired crosslinked structure in the fiber substrate at ambient temperatures (e.g., 10°–40° C.).

In the subsequent pyrolysis step of the process, the precursor fiber (either charred or uncharred) is subjected to a temperature between about 800°–2,500° C., preferably between about 800°–1,500° C., in an oxidizing atmosphere for a period of time sufficient to yield a complex metal oxide fiber substantially free of carbon content. The pyrolysis period normally will range between about 0.2–8 hours.

A weight loss of approximately 40–75% based on the weight of the original precursor fiber is commonly encountered during the pyrolysis step. While undergoing such heating, the charred product assumes a white-hot state which ultimately yields a complex oxide fiber, and the fibrous configuration of the original precursor fiber is maintained.

An alternative method of forming the complex metal oxide fibers is to precipitate the bimetallic complex precursors into previously spun fibers. In this method, a water swellable polymer such as cellulosic polymer, polyvinyl alcohol and the like, is spun into fiber and the fibers are passed into an aqueous bath containing the dissolved AX metallic species. In this bath, the polymeric fiber is swelled and imbibed with the AX metallic species. After loading the fiber with the AX metallic species, the fiber is then passed through a second aqueous bath containing the precipitating [BZ] metallic species. Upon contacting the precipitating bath, the bimetallic complex will be precipitated throughout the swelled polymer. This method is particularly useful when the complex metal oxide can be formed from a single bimetallic complex. The method is clearly an improvement over prior art techniques of impregnating the swelled polymer with a plurality of cationic metal salts wherein each respective metal species competes with the others for sites in the polymer. By such method it is difficult, if not impossible, to provide the correct stoichiometric amount of metal species to form the desired complex metal oxide. By the method of the present invention, the first metallic species can be loaded into the polymer as much as the polymer will receive. The second metal species instead of competing for polymer sites, simply reacts with the first metal species and precipitates out the bimetallic complex at the polymeric sites where the first metal species attached.

If the complex metal oxide can be formed from a single precipitated bimetallic complex, pure complex metal oxide fibers can be obtained by any of the methods of; dispersing the complex metal oxide in particle form in the spinning composition; dispersing the bimetallic complex precursor in particle form in the spinning solution or by in situ precipitation of the bimetallic complex precursor into a swelled polymeric fiber. Any of these methods are useful in forming pure perovskite fibers of $ABO_3$ stoichiometry. If the complex metal oxide, however, must be formed from a mixture of two or more precipitated bimetallic complexes, it is preferred not to utilize the method of in situ precipitation of the respective bimetallic complexes, as it would be most difficult to obtain the necessary atomic mix of the respective metal species. For these complex metal oxides, it is preferred to disperse the complex metal oxide product or mixture of bimetallic complex precursors in powder form into the spinning composition. For the complex metal oxide superconductors, it would thus be preferable to form the complex metal oxide and disperse the powder in the spinning solution or, form a mixture of metallic species, which mixture may contain one or more precipitated bimetallic complexes and disperse same into the spinning solution.

The present invention is applicable to the formation of all types of shaped complex metal oxides. Thus, films, sheets, and articles other than fiber can be formed by dispersing the oxide or oxide precursor into a polymeric carrier and shaping by any conventional means such as hot pressing, rolling, molding, extrusion, injection molding, etc.

The following examples are further illustrative of the present invention. The specific ingredients and processing parameters are presented as being typical, and various modifications can be derived in view of the foregoing disclosure within the scope of the invention.

EXAMPLE 1

Approximately 0.2 moles of reagent grade lanthanum chloride is weighed and dissolved in 200 ml of distilled water. The solution is heated to approximately 65° C. and the precipitating agent is dripped slowly into the vigorously stirred solution. One molar solutions of reagent grade ammonium ferricyanide, ammonium ferrocyanide, and potassium cobalticyanide are used as the precipitating agents. The heating and stirring are continued for an hour after the addition of the precipitating agent. The slurry is filtered, washed with water, and finally with acetone. The air-dried precipitates are $LaFe(CN)_6.5H_2O$; $NH_4LaFe(CN)_6.5H_2O$; and $LaCo(CN)_6.5H_2O$, respectively.

Each of these compounds is calcined at 1,000° C. over-night in air. X-ray diffraction patterns of these calcined products yields no evidence of $La_2O_3$, $Fe_2O_3$, or $La_3Fe_5O_{12}$ and the x-ray patterns and the lines fit closely with those reported for $LaFeO_3$. and $LaCoO_3$.

EXAMPLE 2

This example illustrates the synthesis of a perovskite fiber of formula $LaFeO_3$.

A bimetallic complex comprising $LaFe(CN)_6$ is formed as in Example 1. The precipitated bimetallic complex has an average particle size of about 1 micron.

A dispersion is prepared from the following ingredients:
 100 grams of $LaFe(CN)_6.5H_2O$
 450 grams water
 120 grams polyvinyl alcohol
 1 ml oleic acid as surfactant The dispersion is heated until there is a homogeneous solution containing a suspension of the bimetallic complex precursor. The spinning composition is spun through a 400–600 micron spinneret, and coagulated in a saturated aqueous solution of ammonium sulfate. The filaments are air-dried with draw ratios ranging between 1:1 and 4:1.

The dried fibers are stabilized by chemical treatment with a free radical-forming crosslinking reagent, e.g., by contacting the fibers with diazidoformamide (Hercules S-3060) at room temperature. The stabilized fibers are slowly heated to prevent blistering by outgassing decomposition products. The fibers are heated at 1,000° C. for about 5 hours, and then cooled to room temperature.

EXAMPLE 3

This method describes an alternative method of forming $LaFeO_3$ fibers.

A 150 gram quantity of polyacrylonitrile polymer (PAN, number average molecular weight of 80,000) is dissolved in 800 grams of dimethylacetamide (DMAC) solvent to yield a 16% by weight dope of PAN/DMAC. The spin bath employed for coagulation during fiber formation is a 70/30 by volume mixture of methanol and dimethyl acetamide. A lanthanum chloride dip bath is prepared by mixing 245 grams of $LaCl_3$ in 1 liter of distilled water until all the solids are dissolved into solution.

A second dip bath is prepared by dissolving 266 grams of $(NH_4)_3[Fe(CN)_6]$ in 1 liter of distilled water.

The PAN dope is extruded from a spinning jet and is coagulated in the spin bath (70/30 methanol/DMAC). The formed fiber is passed over rollers and into the lanthanum chloride bath. The fiber is maintained in the bath until the PAN fiber ceases swelling and is imbibed with the lanthanum chloride.

The fiber is passed into the aqueous precipitating bath which causes precipitation of brick red $LaFe(CN)_6.5$-$H_2O$ in the fiber. The fiber is passed through a distilled water bath to wash off unreacted chlorides or cyanides, then over a series of skewed rollers to draw and stretch. The resultant red fiber product is picked up on a bobbin.

The fiber is then stabilized by heating in air at 265° C. The resultant black fiber is pyrolyzed at 1,000° C. in air to yield a perovskite fiber.

EXAMPLE 4

This example describes a method of forming superconductive complex metal oxides of the formula $La_{1.85}Sr_{0.15}CuO_4$.

In a beaker containing 250 milliliters of distilled water, 0.15 mole of $SrCl_2$ is added. A precipitating agent comprising 0.1 mol of a complex of the formula $(NH_4)_3[Cu^I(CN)_4]$ is completely dissolved in distilled water and added drop by drop into the strontium chloride solution. A precipitate is formed with comprises $Sr_3[Cu(CN)_4]_2$.

The pH of the distilled water in the flask is adjusted to a pH of less than 4 by the addition of HCl. Added to the flask is an $[La^{+3}(EDTA\ H_2)^{-2}]$ complex containing 1.85 equivalents of lanthanum. A precipitating complex comprising $(NH_4)_3[Cu^I(CN)_4]$ which contains 0.05 equivalent of copper is added slowly to form a second precipitate comprising $[La(EDTA\ H_2)]_3[Cu^I(CN)_4]$. This complex comprises 0.15 equivalent of lanthanum and 0.05 equivalent of copper.

A copper complex comprising $Cu^{II}(CN)_4$ containing 0.85 equivalent of copper is dissolved in distilled water and added drop by drop to the flask. A third precipitate is formed comprising $[La(EDTA.H_2)]_2[Cu(CN)_4]$ containing 1.7 equivalents of lanthanum in 0.85 equivalent of copper.

The three precipitates are collected, washed with distilled water and air dried. After calcination in air at 800° C., compression into pellets and final calcination at 900° C. in molecular oxygen for 6 hours the final product is $La_{1.85}Sr_{0.15}CuO_4$ and is superconductive.

EXAMPLE 5

This example provides a method for forming the superconductive complex metal oxide $YBa_2Cu_3O_7$.

In a beaker containing 100 ml of distilled water is dissolved 0.1 mole $Y(NO_3)_3$. A precipitating solution of 0.1 mole of $Na_3[Cu^I(CN)_4]$ in 100 mls of water is slowly added while the contents are vigorously stirred. The complex, $Y[Cu(CN)_4]$, precipitates. While stirring the slurry, 0.2 mole of $Ba(NO_3)_2$ are added followed by the slow addition of 0.2 mole of $Na_2[Cu\{(\pm)C_4O_6H_2\}]$, *Fehlings solution. The slurry now consists of the complexes* $Y[Cu^I(CN)_4]$ and $Ba[Cu\{(\pm)C_4O_6H_2\}]$ in a ratio of one equivalent to two equivalents. The sparingly soluble complexes are filtered, washed, and dried. Calcining the resulting powder in air at 900° C. for two hours followed by an annealing step of firing the black solid in molecular oxygen for 10 hours at 1000° C. results in superconducting material $YBa_2Cu_3O_7$.

What is claimed is:

1. A process for producing shaped perovskites, comprising: forming a shaped composition containing an organic fluid polymer having dispersed therein a solid perovskite precurser in powdered form, said perovskite precursor comprising at least one precipitated bimetallic complex of the formula A[BZ] wherein A and B are metals and Z is a ligand associated with metal B, heating said shaped composition at elevated temperatures and in an atmosphere sufficient to burn off said polymer and convert said perovskite precursor to a perovskite, said shaped composition having a sufficient amount of perovskite precursor powder dispersed therein to yield a shaped perovskite upon burning off said polymer.

2. The process of claim 1 wherein said fluid organic polymer is water swellable, and said shaped composition is formed by spinning said water swellable polymer into a fiber, contacting said fiber with an aqueous solution containing a water soluble metal compound of formula AX wherein X is a disassociable anion or a ligand associated with metal A to imbibe said polymer with said metallic compound AX, subsequently contact said imbibed fiber with an aqueous solution of a metal compound M[BZ] where M is a disassociable cation to precipitate within said fiber said bimetallic complex A[BZ].

3. The process of claim 1 wherein said perovskite precursor powder is present in amounts of at least about 40% by weight of said shaped composition.

4. The process of claim 1 wherein said perovskite comprises metals which are substituted for a portion of either the A or B or both A and B sites in the crystal lattice of said perovskite and said perovskite precursor comprises a plurality of said bimetallic complexes wherein A and B in the formula A[BZ] refer to A and B metals and substituted metals therefore.

5. The process of claim 2 wherein said shaped composition is formed by dispersing said perovskite precursor in said fluid organic polymer to form a spinning composition and spinning said spinning composition into fiber form.

6. The process of claim 5 wherein said spinning composition is dry spun.

7. The process of claim 5 wherein said spinning composition is wet spun.

8. A process for producing shaped complex metal oxides said complex metal oxide having the general formula A-B-O, wherein A and B are one or more metals, comprising: forming a shaped composition containing an organic fluid polymer having dispersed therein a powdered complex metal oxide precursor, said precursor comprising at least one precipitated bimetallic complex of the formula A[BZ] wherein A and B are each one or more metals and Z is a ligand associated with metal B, heating said shaped composition at elevated temperatures and in an atmosphere sufficient to turn off said polymer and convert said precursor to complex metal oxide.

9. The process of claim 8 wherein said fluid organic polymer is water swellable, and said shaped composition is formed by spinning said water swellable polymer into a fiber, contacting said fiber with an aqueous solution containing a water soluble metal compound of formula AX wherein X is a disassociable anion or a ligand associated with metal A to imbibe said polymer with said metallic compound AX, subsequently contacting said imbibed fiber with an aqueous solution of a metal compound M[BZ] where M is a disassociable cation to precipitate within said fiber said bimetallic complex A[BZ].

10. The process of claim 8 wherein said complex metal oxide comprises metals which are substituted for a portion of either the A or B or both A and B sites in the crystal lattice of said complex metal oxide and said precursor comprises a plurality of said bimetallic complexes wherein A and B in the formula A[BZ] refer to A and B metals and substituted metals therefore.

11. The process of claim 8 wherein said shaped composition is formed by dispersing said precursor in said fluid organic polymer to form a spinning composition and spinning said spinning composition into fiber form.

12. The process of claim 11 wherein said spinning composition is dry spun.

13. The process of claim 11 wherein said spinning composition is wet spun.

* * * * *